US006518609B1

United States Patent
Ramesh

(10) Patent No.: US 6,518,609 B1
(45) Date of Patent: Feb. 11, 2003

(54) NIOBIUM OR VANADIUM SUBSTITUTED STRONTIUM TITANATE BARRIER INTERMEDIATE A SILICON UNDERLAYER AND A FUNCTIONAL METAL OXIDE FILM

(75) Inventor: Ramamoorthy Ramesh, Silver Spring, MD (US)

(73) Assignee: University of Maryland, College Park, MD (US)

( * ) Notice: Subject to any disclaimer, the term of this patent is extended or adjusted under 35 U.S.C. 154(b) by 0 days.

(21) Appl. No.: 09/652,798

(22) Filed: Aug. 31, 2000

(51) Int. Cl.$^7$ .................. H01L 29/76; H01L 29/94; H01L 31/062
(52) U.S. Cl. ................. 257/295; 257/296; 257/761
(58) Field of Search .................. 257/295, 296, 257/306, 310, 751, 753, 763, 324, 757, 761; 438/3, 240, 627

(56) References Cited

U.S. PATENT DOCUMENTS

| | | | |
|---|---|---|---|
| 5,270,298 A | 12/1993 | Ramesh | 505/1 |
| 5,777,356 A | 7/1998 | Dhote et al. | 257/295 |
| 6,060,735 A | 5/2000 | Izuha et al. | 257/295 |
| 6,258,655 B1 * | 7/2001 | Basceri et al. | 438/240 |

OTHER PUBLICATIONS

Wu et al., "Epitalxial and highly electrical conductive La$_{0.5}$Sr$_{0.5}$TiO$_3$ films grown by pulsed laser deposition in vacuum", *J. Appl. Phys.*, vol. 88, No. 2, Jul. 2000, pp. 700–704.
International Search Report PCT/US 01/27050.
Chang et al., *ULSI Technology*, McGraw–Hill, 1996, pp. 131–134, 395–406.
Tomino et al., "Control of electrical conductivity in laser deposited SrTiO$_3$ thin films with Nb doping", *J. Appl. Phys.*, vol. 76, No. 10, Nov. 15, 1994, pp. 5886–5890.
Nakayama et al., "Electron microscopy study of the "cubic" perovskite phase SrFe$_{1-x}$V$_x$O$_{2.5+x}$ (0.05$\leq$x $\leq$0.1)", *Journal of solid state chemistry*, vol. 71, 1987, pp. 403–417.
Ghosh et al., "Dependence of the conductivity noise of metallic oxide interconnects on the oxygen stoichiometry: a study of LaNiO$_{3-\delta}$", *J. Phys. D.*, vol. 30, Sep. 8, 1997, pp.L75–L80.
Kestigian et al., "Ion–deficient phases in tianium and vanadium componds of the perovskite type," *Journal Am. Chem. Soc.*, vol. 79, 1957, pp. 5598–5601.
Hayashi et al., "Metallic conductivity in perovskite–type compounds AMoO$_3$ (A=Ba, Sr, Ca) down to 2.5K", *Mat. Res. Bull.*, vol. 14, 1979, pp. 409–413.
Bouchard, Jr. et al., Magnetic suseptibility of barium molybdate (IV) and stronium molybdate(IV) in the range 2–300°K, *Inorganic Chemistry*, vol. 7, No. 3, Mar. 1968, pp. 441–443.
Noro et al., "Electrical resistivity of SrRuO$_3$", *J. Phys. Soc. Japan*, vol. 27, 1969, p. 518.

\* cited by examiner

*Primary Examiner*—Olik Chaudhuri
*Assistant Examiner*—Theresa T. Doan
(74) *Attorney, Agent, or Firm*—Charles S. Guenzer

(57) ABSTRACT

A ferroelectric memory cell formed on a monocrystalline silicon underlayer, either an epitaxial silicon contact plug to a transistor source or drain or silicon gate region for which the memory cell forms a non-volatile gate. A conductive barrier layer of vanadium or niobium substituted strontium titanate is epitaxially grown over the silicon, and a lower metal oxide electrode layer, a ferroelectric layer and an upper metal oxide electrode layer are epitaxially grown on the barrier layer. No platinum barrier is needed beneath the ferroelectric stack. The invention can be applied to many other functional oxide devices including micromachined electromechanical (MEM) devices and ferromagnetic trilayer devices.

17 Claims, 4 Drawing Sheets

NIOBIUM OR VANADIUM SUBSTITUTED STRONTIUM TITANATE BARRIER INTERMEDIATE A SILICON UNDERLAYER AND A FUNCTIONAL METAL OXIDE FILM

FIELD OF THE INVENTION

The invention relates generally to thin film devices having a functional metal oxide layer, for example, a perovskite ferroelectric memory or high dielectric constant capacitor material. In particular, the invention relates to forming such thin film devices on silicon substrates.

BACKGROUND ART

Significant developments have been accomplished in the past few years in the growth and processing of ferroelectric and high dielectric metal oxide thin films for a variety of microelectronic applications. Much of the work has focus on potential integration of these metal oxide films into volatile and non-volatile memories. These efforts blossomed in the early 1980s primarily through pioneering efforts in the sol-gel processing, chemical vapor deposition (CVD), and sputter deposition of multi-component metal oxide thin films. These techniques facilitated the fabrication of submicron thin films of ferroelectric materials such as lead zirconate titanate (PZT) and other cationically substituted derivatives of PZT on silicon substrates.

The prototypical structure for a high-density memory cell that evolved from these efforts is schematically illustrated in FIG. 1. A silicon substrate 10 is formed with a large number of memory cells, one of which is illustrated. A source 12 and drain 14 are doped into substrate 10 by ion implantation. A pass gate transistor structure including a gate oxide 16 and metallization 18 is formed over the gate region between the source 12 and drain 14 to form a MOS transistor. Electrical power is supplied to the source 12 by an unillustrated line. The transistor structure is then covered with a first-level dielectric layer 20 typically of $SiO_2$ or a related silicate glass. A contact hole is etched in the oxide dielectric layer 20 over the transistor drain. Polycrystalline silicon is filled into the contact hole to form a silicon plug 22 making electric contact with the transistor drain 14.

The ferroelectric device, in this case, a ferroelectric memory capacitor, is formed over the polysilicon plug 22. The dramatic difference in chemistries between the ferroelectric oxides and silicon necessitates the introduction of a diffusion barrier to eliminate any diffusion of oxygen from the metal oxide ferroelectric layer or other oxide layers to the components of the semiconductor transistor. Even the oxidation of the top of the silicon plug 22 would create a insulative electrical barrier of $SiO_2$ between the ferroelectric capacitor cell and the silicon transistor. The fact that the barrier must be a good electrical conductor and form an ohmic contact to silicon further complicates the selection of barrier materials.

For reasons to be discussed immediately below, a typical barrier consists of a layer 24 of titanium nitride (TiN) and a layer 26 of platinum immediately underlying a lower electrode layer 28. These layers 24, 26, 28 are patterned to form a lower ferroelectric stack. A shaped diffusion barrier layer 30, for example, of titanium oxide ($TiO_2$) is deposited an patterned to have an aperture over the top of the lower ferroelectric stack. A ferroelectric layer 32 is then deposited, for example of PZT or its generalization PLNZT, followed by an upper electrode layer 34, and an upper platinum barrier layer 36. The $TiO_2$ diffusion barrier layer 30, the ferroelectric layer 32, the upper electrode layer 34, and the upper platinum barrier layer 34 are patterned to have larger area than that of the aperture over the lower ferrroelectric stack. These depositions complete the ferroelectric stack.

A $SiO_2$ inter-level dielectric layer 38 is deposited and patterned to have a via hole overlying the upper platinum electrode layer 36 of the ferroelectric stack. A contact barrier layer 40, for example of conductive TiN or TiW, is coated at the bottom of the via hole, and a metallization 42, for example, of aluminum or tungsten, is filled into the remainder of the via hole, thereby providing an upper electrical contact to the ferroelectric stack.

Platinum is chosen for the barrier, particularly the lower barrier, primarily because of its refractory nature and resistance to oxidation, unlike, for example, the more common aluminum. Platinum barriers enable ferroelectric capacitors with very desirable basic properties, such as large values of remanent polarization $\Delta P$, ferroelectric film resistivities of greater than $10^{10}\Omega$-cm, and sufficient retention characteristics.

Titanium nitride is another obvious choice for a barrier layer, especially since it is already widely used in the semiconductor industry as a diffusion barrier. Unfortunately, TiN oxidizes at about 500° C., which is much lower than the optimum process temperature for ferroelectric materials. To overcome the shortcoming of the TiN in terms of temperature, platinum or iridium (Ir) have been used as protective layers. Another common approach is to dope TiN with Al to form (Ti, Al)N or to use silicides or other complex structures. The most common approaches being currently explored use a combination of at least two layers to create a composite barrier layer, such as that in FIG. 1. Taking the PZT ferroelectric material as an example, one approach uses the combination of (Ti, Al)N/(Pt, Ir) as the composite barrier. The structure of FIG. 1 uses a special case of this composite barrier.

However, the above structure presents continuing problems. Even though platinum is a refractory metal and does not oxidize, it is nonetheless fairly porous to oxygen. That is, it does not prevent oxygen from diffusing to the underlying silicon plug and oxidizing a resistive surface layer there. Furthermore, such devices have been observed to suffer fundamental reliability problems. For example, if the test capacitors are repeatedly cycled for more than $10^7$ to $10^8$ bipolar cycles, the amount of remanent polarization still available becomes progressively smaller, and eventually the non-volatile capacitor functionally fails.

The use of platinum or iridium in the barrier or other parts of the stack presents other technological and strategic problems. First, dry etching of Pt or Ir is still very difficult although there have been some recent breakthroughs. A dry etch process, such as reactive ion plasma etching, is considered to be essential for commercial memories to be manufacturable with high yield. Since both Pt and Ir are relatively inert (although Ir does form stable oxides), the ability to form volatile reaction species during dry etching appears to be severely limited. Secondly, both Pt and Ir are considered to be precious metals, not only expensive but of uncertain supply in such quantities required for widespread commercialization. As a result, the economics of supply and demand may impact the feasibility and dependability of using these precious metals in large quantities.

In view of the problems with platinum and iridium, I and others have developed the use of other alloys and compounds that eliminate the need for including these precious metals. The results have been scientifically interesting and offer much promise. In U.S. Pat. No. 5,777,356, Dhote and I describe the use of intermetallic alloys as the conducting barrier layer, without the use of Pt or Ir. An intermetallic alloy is typically composed of two refractory metals in relative compositions that are stoichiometric or nearly so. This approach has been shown to be effective with a Ti/Al-based intermetallic alloy directly contacting the polysilicon plug. A metal oxide, lanthanum strontium cobalate (LSCO) is used as the lower electrode since it has been observed to provide some crystallographic templating for the overgrown PZT ferroelectric. However, the templating is effective only for the out-of-plane orientation, and the in-plane orientation is polycrystalline in a pattern which may be characterized as a mosaic crystal or (001)-texturing.

I have suggested another approach in U.S. Pat. No. 5,270,298 in which a barrier layer of ytrria-stabilized zirconia (YSZ) is overlaid by a strongly templating layer of an anisotropic perosvksite such as bismuth titanate before the LSCO electrode is deposited. The templating layer controls the crystallographic orientation and assures the phase stability of the over grown cubic LSCO perovskite layer. This approach has proven very effective, but it requires the deposition of two different layers, namely the buffer and templating layers.

This problem, termed fatigue, fundamentally limits the operation of non-volatile ferroelectric memories since these capacitors are generally used in a mode requiring traversing the hysteresis loop during every write and read operation, hence their designation of destructive read-out memories (DROs).

The problem of fatigue has in large part been overcome through one of two approaches, either using conductive metal oxide electrodes or replacing the PZT with another ferroelectric material, strontium bismuth titanate (SBT). However, the templating provided by conductive metal oxides such as LSCO is incomplete, and the resulting PZT is only (001)-textured. This can be overcome by use of additional layers, such as YSZ or BST, but the number of required deposition steps is increased, and the monocrystallinity of the PZT is still not guaranteed. On the other hand, SBT is disadvantageous.

I and others have recently disclosed a different approach for a related structure in U.S. patent application Ser. No. 09/624,527, filed Jul. 24, 2000, entitled MICROELECTRONIC PIEZOELECTRIC STRUCTURE AND METHOD OF FORMING THE SAME, and incorporated herein by reference in its entirety. In this process, a layer of (Ba, Sr)TiO$_3$ is grown on a crystalline silicon wafer. The preferred composition is strontium titanate (SrTiO$_3$ or STO), which is grown under conditions that the strontium titanate is grown to be epitaxial to the silicon, that is, monocrystalline, and the subsequently deposited LSCO and PZT are also monocrystalline. FIG. 2 shows a hysteresis curve 50 for polycrystalline PZT, hysteresis curve 52 for (001)-textured PZT, and hysteresis curve 54 for epitaxial and monocrystalline PZT grown on strontium titanate that is epitaxially grown on monocrystalline silicon according to the method of the aforecited patent application to Ramesh et al. Clearly, the epitaxial PZT shows the best behavior with both the saturation and remanent polarization increasing with crystallinity. X-ray diffraction data verify the crystalline states of the samples, as described above.

However, strontium titanate cannot be simply added to the memory cell structure of FIG. 1 since strontium titanate is a dielectric or at best a semiconductor, having a room temperature resistivity of somewhat more than 1 ohm-cm, which for a 100 nm or even 1 μm square conduction path amounts to a small strontium titanate capacitor in series with a large PZT capacitor so that substantially the entire voltage drop is across the parasitic STO capacitor. As a result, the use of an STO barrier requires providing another current path into the lower capacitor electrode than through the underlying silicon. The memory cell structure illustrated in the aforecited patent application to Ramesh et al. includes a separate top contact to the bottom LSCO electrode providing a conductive path that avoids the STO layer.

It would be greatly desired to provide a barrier layer over silicon that is epitaxial to silicon and is also electrical conductive.

It would be also desired to extend the concepts of templating STO layers to other classes of devices and to improve upon the known types of STO templating.

SUMMARY OF THE INVENTION

According to one aspect of the invention, a conductive barrier layer of (Sr, Ba)(Ti, V, Nb, Ta)O$_3$ is formed between a silicon underlayer and a functional metal oxide layer, such as a ferroelectric device. Preferably, the silicon underlayer is monocrystalline and the functional metal oxide layer and any intermediate metal oxide electrode layers are epitaxial to the silicon underlayer.

According to another aspect of the invention, a barrier layer of (Sr, Ba) (Ti, V, Nb, Ta)O$_3$, which is not necessarily conductive and may include SrTiO$_3$ is used as a templating barrier for the growth of monocrystalline functional metal oxide films used for both non-volatile ferroelectric memories and for other applications.

According a third aspect of the invention, the composition of the (Sr, Ba) (Ti, V, Nb, Ta)O$_3$ film is chosen to be lattice matched to silicon.

According to a fourth aspect of the invention, an epitaxial metallic layer is grown between the silicon underlayer and the conductive barrier layer and may include either an intermetallic alloy or a silicide.

DETAILED DESCRIPTION OF THE PREFERRED EMBODIMENTS

Figure 3:
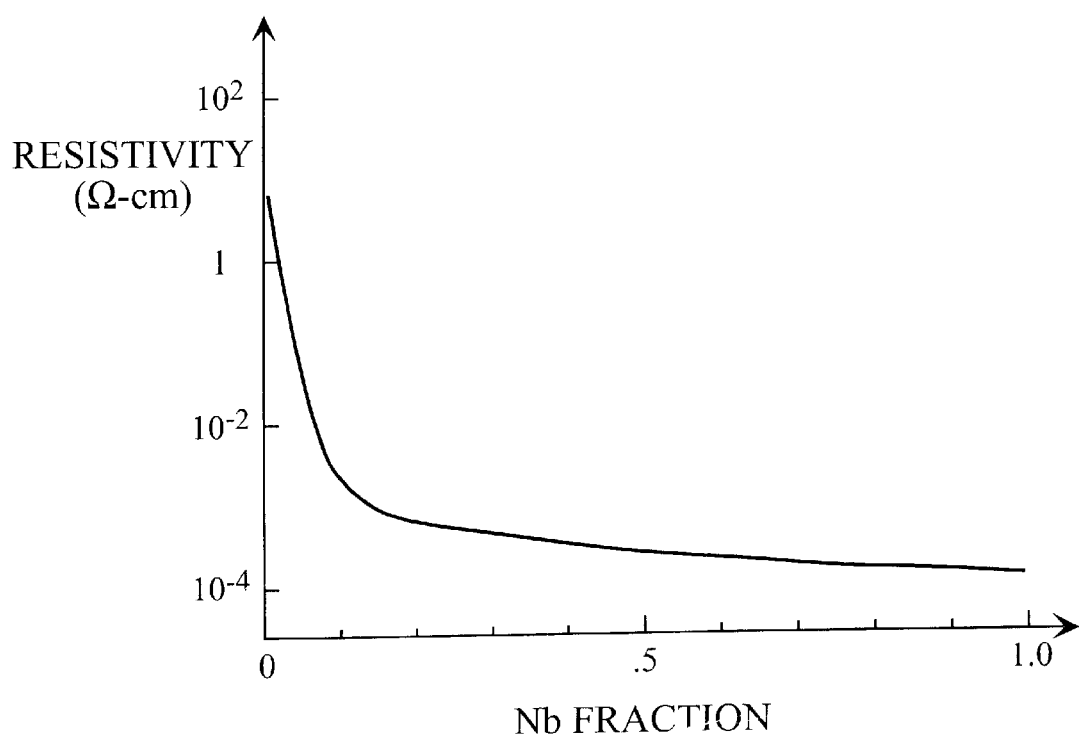
FIG. 3 is a cross-sectional view of a ferroelectric memory cell of a first embodiment of the invention using a doped barrier layer over a transistor drain.

Strontium titanate (SrTiO$_3$), barium titanate (BaTiO$_3$), and their alloys may be characterized as wide band gap semiconductors having relatively high resistivities at room temperature. Both Sr or Ba are Group IIA elements having a +2 ionization state; Ti, a Group IVB element, has a +4 ionization state; and, oxygen has a −2 ionization state, thus accounting for the lack of free charge carriers in these materials. However, if the Group VB niobium (Nb) is substituted for the titanium, either partially or fully, its +5 ionization state supplies free electron carriers. Thereby, substitution of niobium decreases the resistivity of the material. Tomio et al. has characterized the crystallographic and electrical characteristics of the $SrTi_{1-x}Nb_xO_3$ alloy system in "Control of electrical conductivity in laser deposited $SrTiO_3$ thin films with Nb doping," *Japanese Journal of Applied Physics*, vol 76, no. 10, Nov. 15, 1994, pp. 5886–5890. Pure $SrTiO_3$ shows a temperature dependence of its resistivity consistent with its being a semiconductor. On the other hand, $SrNbO_3$ shows a temperature dependence consistent with its being a metal. Its electrical resistivity as a function of alloying percentage x is shown in the graph of FIG. 3. Alloying the strontium titanate with even 10% of Nb will significantly reduce the resistivity of the barrier film such that it can be considered conductive, particularly when the barrier thicknesses are in the range of 5 nm to a few hundreds of nanometers.

Similarly good effects can be obtained with doping with vanadium (V), which is just above niobium in Group VB in the periodic table and also has a +5 oxidation state, so that vanadium substitution of strontium titanate increases the electrical conductivity. The resistivity of $SrVO_3$ has been reported at 90 ohm-cm. Vanadium has the further advantage of a smaller ionic radius than both niobium and titanium, as tabulated in TABLE 1. Strontium titanate has a lattice constant (0.391 nm) that, when multiplied by 1.414 (square root of two), is only slightly larger than the silicon lattice constant (0.543 nm). As a result, a thin layer of $SrTiO_3$ can be grown epitaxially on (001)-oriented silicon by having its (001) axis aligned with the (011) axis of Si. As shown by Tomio et al., ibid., the lattice constant increases with niobium doping, as would be expected since the ionic radius of niobium is greater than that of titanium so that the pseudomorphic thickness of niobium substituted strontium titanate of which excessive stress builds up is reduced.

TABLE 1

| | Charge State | Ionic Radius (nm) |
|---|---|---|
| Ti | +4 | 0.068 |
| V | +5 | 0.059 |
| Nb | +5 | 0.070 |
| Ta | +5 | 0.073 |

Therefore, the lattice constant of $SrTi_{1-x}Nb_xO_3$ becomes progressively larger than the (011) lattice constant of Si for increasingly larger niobium fractions x. On the other hand, Kestigian et al. in "Ion-deficient phases in titanium and vanadium compounds of the perovskite type," *Journal of the American Chemical Society*, vol. 79, 1957, pp. 5598–5601, have reported the lattice constant of $SrVO_{2.5}$, closely related to $SrVO_3$, to be 0.3848 nm. Therefore, a vanadium substituted alloy $SrTi_{1-y}V_yO_3$ can be used to both better lattice match to silicon and to increase the conductivity of the alloy. Furthermore, a niobium and vanadium substituted alloy $SrTi_{1-x-y}N_yO_3$ can be used which further increases the electrical conductivity while still maintaining lattice matching to silicon. Kestigian et al., however, predict that stoichiometric $SrVO_3$ will not form in the desired cubic form so lower percentage of vanadium alloying is expected to permit epitaxial growth over silicon. The remaining Group VB element is tantalum (Ta) which will provide similarly increased electrical conductivities. However, Ta substitution worsens the lattice mismatch to the (011) lattice constant of Si. Instead, it may be advantageously used in combination with Nb or V ($SrTi_{1-x-y}Nb_xV_yTa_3$ with x and/or y being greater than zero) or with other orientations of silicon. It is noted that these compositions need not be strictly stoichiometric.

The compositions given for these perovskite metal oxides need not be precise. It is well known that these perovskite materials can be substantially deficient in oxygen from the indicated $O_3$, for example, an oxygen content above $O_{2.7}$, and still form as crystalline or polycrystalline materials.

Figure 4:
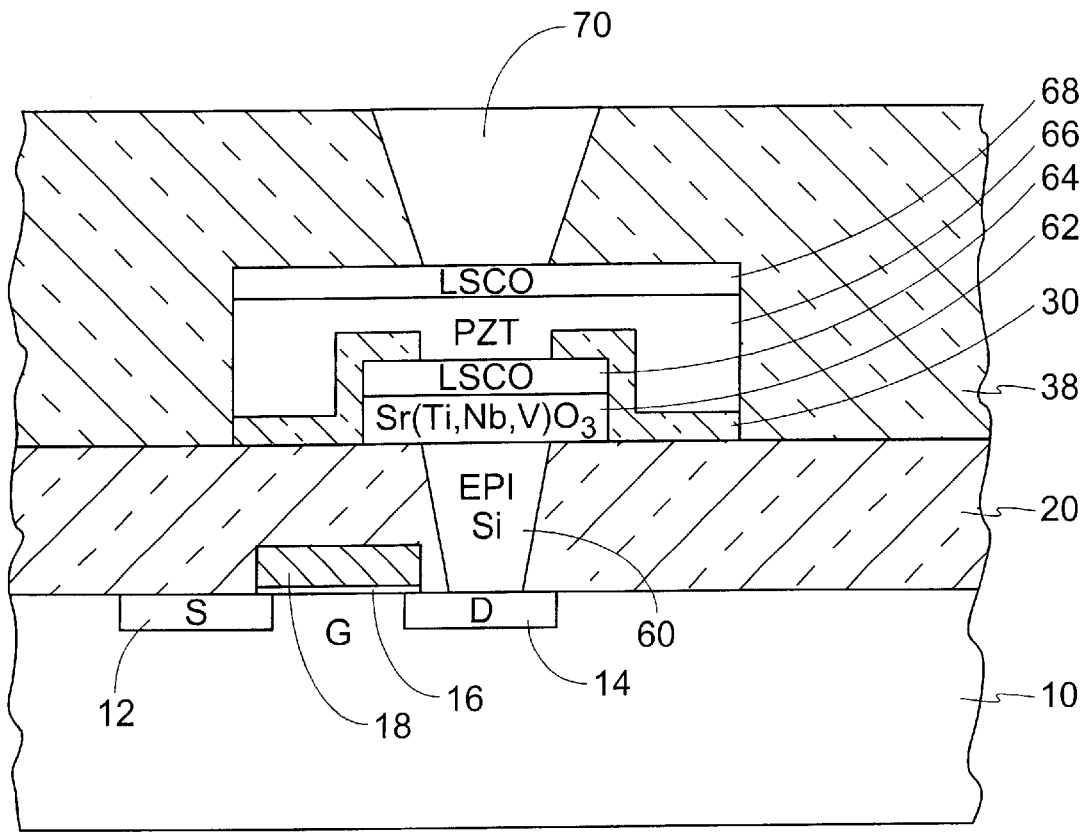
FIG. 4 is a cross-sectional view of a structure using an additional epitaxial metallic barrier between crystalline silicon and crystalline doped barrier layer.

A ferroelectric memory cell utilizing the above effects is illustrated in the cross-sectional view of FIG. 4. A heavily doped epitaxial silicon plug 60 is grown by the method of selective epitaxial growth of silicon described by Chang et al. in *ULSI Technology* (McGraw Hill, 1996), pp. 131–134. The doping type of the silicon plug 60 is chosen to be that of the drain 12 to eliminate an Schottky barrier therebetween. The epitaxial silicon plug 60 provides both an electrical contact to the underlying drain 12 and an upward extension of the crystalline structure of the silicon substrate 10.

Then, following the methods of the aforecited U.S. Patent Application to Ramesh et al., a monocrystalline niobium and vanadium substituted strontium titanate ($SrTi_{1-x-y}Nb_xV_yO_3$ or STNVO) barrier layer 62 is epitaxially formed over the crystalline silicon plug 60 to a thickness preferably of 3 to 50 nm. For a conductive barrier, either x or y needs to be greater than zero and x+y should be no greater than one. Tantalum, although not directly addressed here, can be substituted into STNVO. Otherwise, the values of x and y need not be limited. Both $SrNbO_3$ and $SrVO_3$ as well as $SrNb_xV_{1-x}O_3$ may be used as conductive monocrystalline barriers. As mentioned above, x and y are preferably chosen to provide lattice matching or near lattice matting of the alloy to crystalline silicon. The width of the STNVO barrier layer 62 should not be much greater than the width of the crystalline silicon plug 60 because portions of the STNVO barrier layer 62 overhanging the field oxide 20 will have much reduced tendency to form epitaxially with the silicon.

A perovskite metal oxide lower electrode layer 64 is epitaxially grown on the monocrystalline crystalline STNVO barrier layer 62. The lower electrode layer 64 is preferably composed of lanthanum strontium cobalate ($LaSr_{1-x}Co_xO_3$ or LSCO), where x is preferably about 50%. After the deposition and aperture patterning of the $TiO_2$ shaped barrier layer 28, a ferroelectric layer 66 is grown on the monocrystalline lower electrode layer 64. It may be composed of PZT or more generally $Pb(La,Nb)Zr_{1-x}Ti_xO_3$ (PLNZT) or yet other ferroelectric materials. At least in the regions of the barrier aperture over the monocrystalline LSCO lower electrode layer 62, the ferroelectric layer 66 can be deposited epitaxially and in monocrystalline form. An upper electrode layer 68 is grown over the ferroelectric layer 66, preferably in monocrystalline form over the central portion of the ferroelectric layer 66. It may be composed of LSCO, just as the lower electrode layer 64.

Figure 1:
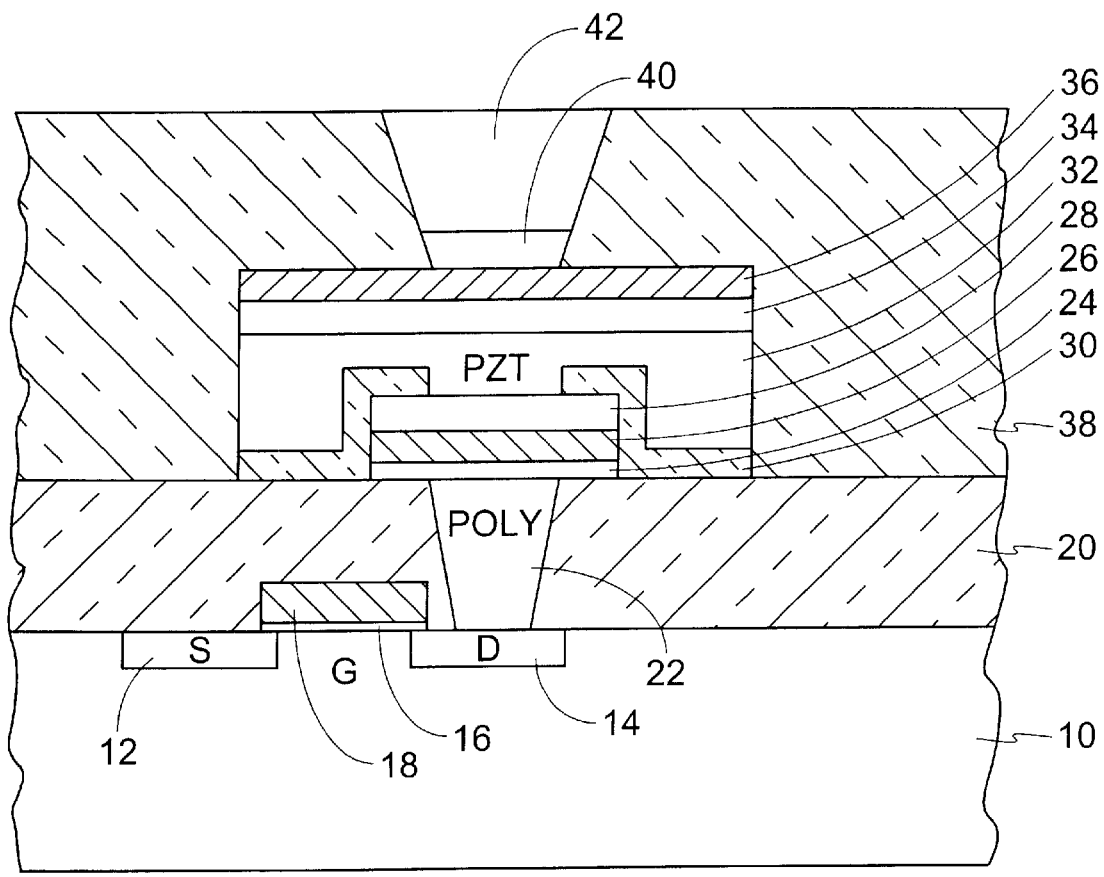
FIG. 1 is a cross-sectional view of a conventional ferroelectric memory cell.
Figure 2:
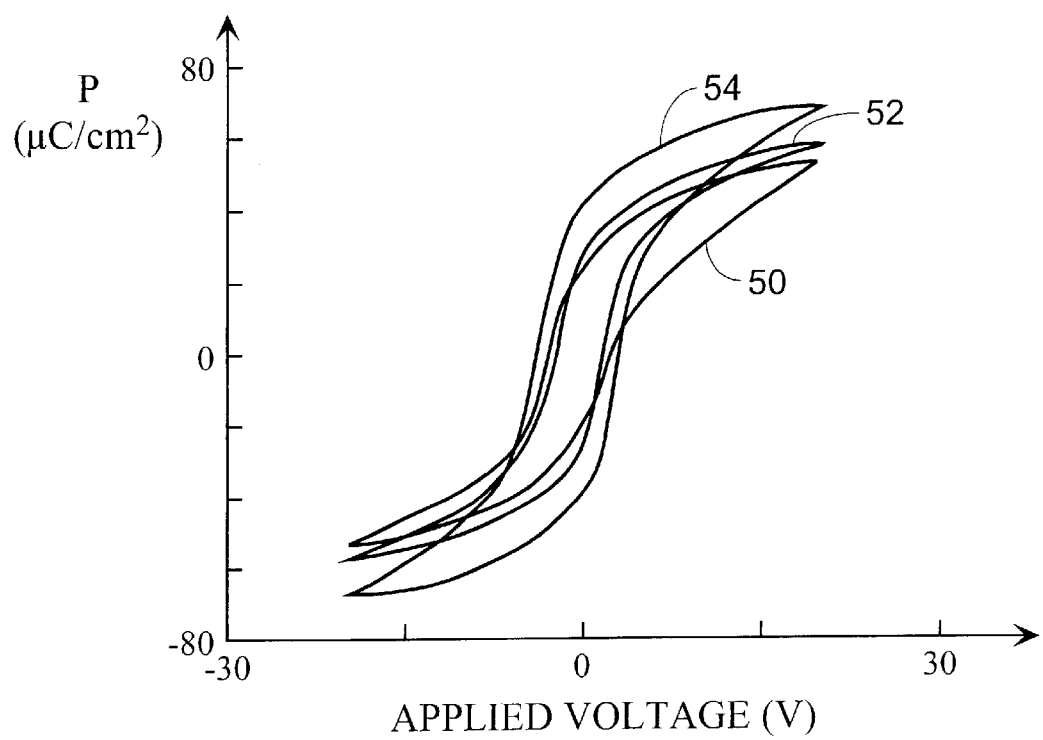
FIG. 2 is a graph showing the ferroelectric hysteresis curves for PZT in three different crystalline states.

Thereafter, the fabrication and the structure of the memory cell of FIG. 4 follows that of the prior art memory cell of FIG. 1 with a barrier plug 70 overlying the upper LSCO electrode layer 68. The barrier plug 70 preferably includes at least a barrier portion of platinum or an intermetallic alloy.

This memory cell structure provides both a conductive barrier and a monocrystalline ferroelectric layer with its attendant highly desirable hysteretic and fatigue characteristics. The ferroelectric and related materials are also usable as capacitor gap materials having a high dielectric constant. In this mode of operation, hysteresis is not required.

Figure 5:
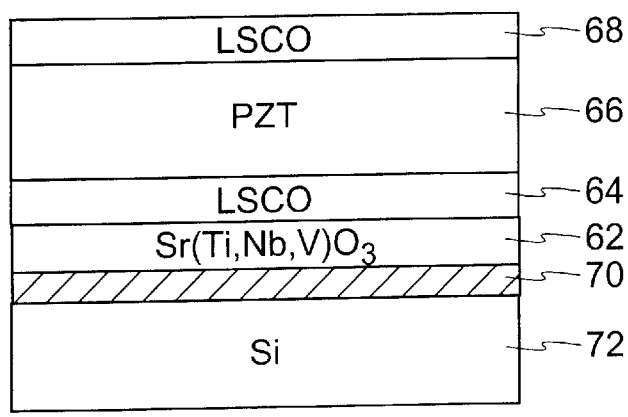
FIG. 5 is a cross-sectional view of a metallic barrier expitaxially formed on silicon.

To benefit from the conductive barrier described above, the relatively thick silicon oxide layer of the Ramesh et al. patent application should be avoided by the use of, for example, a lower oxygen pressure during the STNVO deposition or other process conditions. It has been determined that the silicon oxide layer is not inherently formed between STO and silicon using the general method of the patent application. Alternatively, as illustrated in the cross-sectional view of FIG. 5, a thin metallic barrier layer 71 is epitaxially formed over a monocrystalline silicon layer 72, such as the epi silicon plug 60 of FIG. 4, and the Sr(Ti, Nb, V)O$_3$ layer 62 is epitaxially deposited on the monocrystalline metallic barrier layer 71. It is known that very thin layers of some metals can be epitaxially formed over silicon. Such a monocrystalline metallic layer provides a template for the subsequent epitaxial growth of the niobium and vanadium substituted strontium titanate and may also be used to prevent an appreciable amount of oxygen from reaching the silicon layer 72. The metal may be one of the intermetallic alloys of the Dhote et al. patent. Alternatively, the metallic barrier may be composed of a silicide, such as titanium silicide, tungsten silicide, or tantalum silicide, formed by depositing a thin metal layer over the silicon and then subjecting the structure to rapid thermal processing (RTP). As described by Chang et al., ibid., pp. 395–406, this process is capable of nucleating monocrystalline titanium silicide when annealed at 700 to 750° C.

Other perovskite metal oxides may be used for one or both of the electrode layers, =including strontium ruthenate. The non-perovskite metal oxides RuO$_2$ and IrO$_2$ have a low resistivity but generally do not provide the epitaxial growth desired for the electrode layers. The electrode layers may be deposited by chemical vapor deposition (CVD), sputtering, or pulsed laser deposition (PLD) at temperatures preferably in the range of 400 to 600° C. The ferroelectric layer may be deposited in the same temperature range by CVD, solgel, or sputtering.

Figure 6:
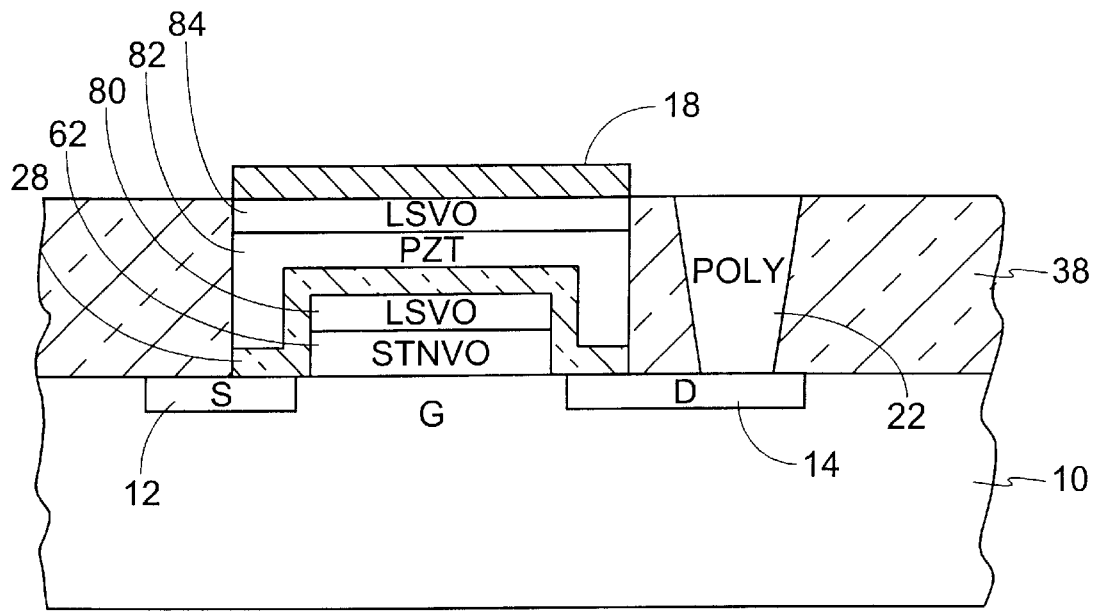
FIG. 6 is a cross-sectional view of a ferrroelectric memory cell of a second embodiment of the invention using a doped barrier layer over a transistor gate.

A second type of device utilizing the conductive barrier of the invention is a nonvolatile field-effect transistor illustrated in cross-section in FIG. 6. This structure replaces the gate dielectric layer 16 of FIGS. 1 and 4 with a ferroelectric stack including the monocrystalline Sr(Ti, Nb, V)O$_3$ conductive barrier 62, a monocrystalline lower electrode layer 80 of lanthanum strontium vanadate (La$_{1-x}$Sr$_x$VO$_3$ or LSVO), a ferroelectric layer 82 of PZT or more generally PLNZT, and an upper electrode layer 84 of LSVO covered by the metallization 18. The LSVO is one of many conductive metal oxides that may be used in place of LSCO. The silicon plug 22 may be either polysilicon or epitaxial silicon. To prevent the conductive STNVO barrier layer 62 from shorting the source 12 and drain 14, the width of the lower section of the metal oxide stack should be no wider than the gate region G between the source 12 and drain 14. This structure has the effect of a floating gate that remains open or closed dependent upon the state of a nonvolatile signal impressed on the ferroelectric stack and thereafter removed. That is, the structure provides a non-volatile gate on a transistor.

Figure 7:
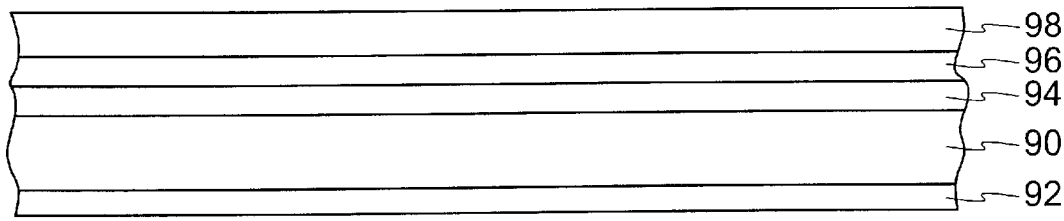
FIGS. 7 and 8 are two cross-sectional views of the formation of a micromachined electromechanical (MEM) device.

The invention may be extended to structures not requiring a conductive barrier, in which case non-substituted SrTiO$_3$, can be effectively used as well. One such structure is a generic micromachined electro mechanical (MEM) device. As illustrated in the cross sectional view of FIG. 7, a silicon wafer 90 is coated on its back side with a hard mask layer 92 of silicon nitride (Si$_3$N$_4$) and on its front with a strontium titanate layer 94, possibly substituted with niobium or vanadium, a lower electrode layer 96 of, for example, LSCO, and a piezoelectric layer 98 of, for example, PZT or more geneally PNLZT. The strontium titanate layer 94, electrode layer 96, and piezoelectric layer 98 are preferably all grown to be epitaxial to the monocrystalline silicon wafer 90. Additional layers may be grown over the piezoelectric layer 98 dependent on the type of MEM device that is desired. It is understood that a piezoelectric layer typically provides other electrically dependent characteristics, such as required for bolometric or thermoelectric devices.

Figure 8:
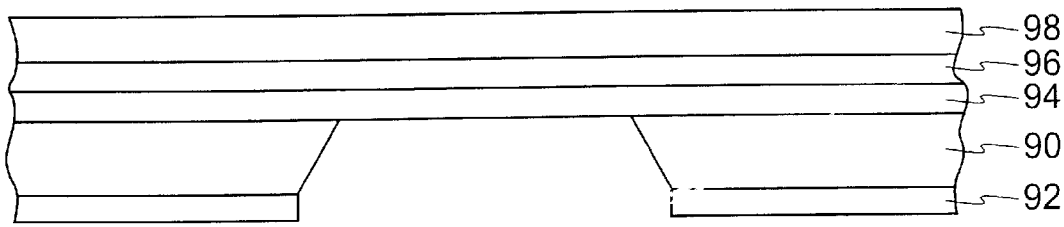

The hard mask layer 92 is photolithographically patterned, as illustrated in the cross-sectional view of FIG. 8, to form a mask aperture having a dimension of the order of 1 µm. Deep reactive ion etching (RIE) is then performed to completely etch through the silicon wafer 90 and to leave suspended a micrometer cantilever of the piezoelectric layer 98 and attached barrier layer 94 and lower electrode layer 96. Such a piezoelectric cantilever forms the core structure of a MEM device, and a monocrystalline piezoelectric cantilever offers increased performance and reliability. It is appreciated that the MEM device achievable is not limited to the simple illustrated structure. Other sequences of functional metal oxide layers are possible, particularly in combination with a piezoelectric layer. In some applications, the cantilever extends only part way across the underlying aperture, for example, providing a deflecting arm. The aperture also may be formed from the front side of the wafer by isotropically etching the silicon layer wafer 90 (which is much thicker than illustrated) around a masked portion of the metal oxide layers 94, 96, 98 so as to undercut the metal oxide layers and leaving the masked portion cantilevered from one or both sides of the aperture extending only part way through the silicon wafer 90.

The invention is not limited to the described ferroelectric memories and piezoelectric MEMs. Many other devices achievable with the invention are briefly tabulated in TABLE 2.

TABLE 2

| Use | Layer-1 | Layer-2 | Layer-3 | Layer-4 |
|---|---|---|---|---|
| Non-volatile Memories | STNVO | LSCO | PLNZT | LSCO |
|  |  | LSVO |  | LSVO |
|  |  | RuSr$_{1-x}$Ca$_x$O$_3$ |  | RuSr$_{1-x}$Ca$_x$O$_3$ |
|  |  | CrLa$_{1-x}$Sra$_x$O$_3$ |  | CrLa$_{1-x}$Sra$_x$O$_3$ |
|  |  | NiLa$_{1-x}$Sra$_x$O$_3$ |  | NiLa$_{1-x}$Sra$_x$O$_3$ |
| FETs | STNVO | LSVO | PLNZT | LSVO |
| Pyroelectric IR | STNVO | RuSr$_{1-x}$Ca$_x$O$_3$ | PLNZT | RuSr$_{1-x}$Ca$_x$O$_3$ |

TABLE 2-continued

| Use | Layer-1 | Layer-2 | Layer-3 | Layer-4 |
|---|---|---|---|---|
| Sensors | | $CrLa_{1-x}Sra_xO_3$ $NiLa_{1-x}Sra_xO_3$ LSCO, LSVO | | $CrLa_{1-x}Sra_xO_3$ $NiLa_{1-x}Sra_xO_3$ LSCO, LSVO |
| Piezoelectric MEMs | STNVO | $RuSr_{1-x}Ca_xO_3$ $CrLa_{1-x}Sra_xO_3$ $NiLa_{1-x}Sra_xO_3$ LSCO, LSVO | PLNZT | $RuSr_{1-x}Ca_xO_3$ $CrLa_{1-x}Sra_xO_3$ $NiLa_{1-x}Sra_xO3$ LSCO, LSVO |
| SFRAM | STNVO | LSCO | PLNZT | $In_2O_3$; $SnO_2$ |
| Optical Devices | STNVO STNVO STNVO | PLNZT $LiNbO_3$ $Bi_4Ti_3O_{12}$; BST; SBNT | | |
| BST, DRAMs | STNVO | LSCO | $TiBa_{1-x}Sr_xO_3$ | LSCO |
| Decoupling Capacitors | STNVO | $RuSr_{1-x}Ca_xO_3$ $CrLa_{1-x}Sr_xO_3$ $NiLa_{1-x}B_xO_3$ | $TiBa_{1-x}Sr_xO_3$ | $RuSr_{1-x}Ca_xO_3$ $CrLa_{1-x}Sr_xO_3$ $NiLa_{1-x}Ba_xO_3$ |
| Uncooled IR Sensor | STNVO | $MnLa_{1-x}Ca_xO_3$ $MnLa_{1-x}Ba_xO_3$ | | |
| Bolometer, | STNVO | MRCSBO | PLNZT | MRCSBO |
| Tunnel Junction | STNVO STNVO | MRCSBO $Fe_3O_4$ | $TiBa_{1-x}SrO_3$ | MRCSBO |
| Spin Valve | STNVO | MRCSBO | $TiBa_{1-x}SrO_3$ | MRCSBO |
| Microwave Ferrite on Si | STNVO | $AB_2O_4$ | | |
| Barrier | STNVO | Ti(Al)N | | |
| Metal | STNVO | Pt, Ir, Fe, Cu, Ni, Co | | |
| High-Temp. Superconductor | STNVO | YBCO, BSCCO | | |
| Thermoelectric | STNVO STNVO | $TiBa_{1-x}La_xO_3$ MRCSBO | | |

In this table, SFRAM is static ferroelectric ram; BST is bismuth strontium titanate; DRAM is dynamic random access memory: CMR stands for collosal magneto resistance, a class of magnetoresistive materials used in magnetic read heads; MRCSBO stands for $MnRE_{1-x}(Ca,Sr,Ba)_xO_3$ where RE represents the rare earth elements including lanthanum (La) through lutetium (Lu) in the periodic table and the presence of Ca, Sr, Ba may be in a range of fractions including zero that sum to one; YBCO is yttrium barium copper oxide and BSCCO is bismuth strontium calcium cuprate, both cuprate high-temperature superconductors. It is noted that the alloying percentages in the table are not limited so that, for example, $RuSr_{1-x}Ca_xO_3$ includes $SrRuO_3$ and $NiLa_{1-x}Sr_xO_3$ includes $LaNiO3$. The above listed materials, such as perovskite ferromagnetic oxide (both magnanites and ferrites), spinel ferrites, perovskite thermoelectrics, etc. can all be deposited on the surfaces of STNVO (including STO) to create novel devices with improved characteristics. All these oxide materials are functional metal oxide providing electrical characteristic other than electrical resistivity that can be advantageously employed in many classes of devices. These oxide materials can all be characterized as dielectrics having an electrical resistance significantly higher than that of the conductive metal oxides such as LSCO, etc. Most of these materials are multi-component (multi-metal) oxides, although a few have only a single metal component. The invention, however, can be advantageously applied to generic metals and barriers such as Ti(Al)N. The magnetic perovskites have the same or nearly the same crystal structure as LSCO or STO. These materials, especially those in which the magnetic species is manganese, show very interesting temperature dependence of the magnetic properties together with a metal-insulator phase transition. Their transport properties are strongly dependent on magnetic and electric fields, that is, the colossal magnetoresistance or electroresistance effects. The fact that they are very similar in crystal structure and chemistry to other perovskites such as STO, NbSTO, etc. means that lattice matched heterostructures can be built in combination with other perovskites, as appropriate for the device. One such device is a spin valve including a trilayer of a ferromagnet, metal, and ferromagnetic. Another such device is a magnetic tunnel junction including a trilayer of a ferromagnet, insulator, and ferromagnet.

These magnetic perovskites can also be used in bolometric applications, that is, applications in which a change in temperature is sensed as a change in resistance. Bolometry benefits from the large change in resistance at the metal-insulator transition of the magnetic perovskites. A thin film of such a material can then sense radiation, for example, infrared radiation, through a change of its temperature dependent resistance. At the peak of the plot between resistance and temperature, magnetic perovskites can show temperature coefficients of resistance (dR/dT÷R) of 5 to 18%. For comparison, vanadium oxide which is currently used as a bolometric sensors shows a value of 2.5%. Epitaxial films of the magnetic perosvkites formed over silicon are very desirable.

Microwave spinels are oxide compounds of the general formula $AB_2O_4$. The A species is typically a metal species having a +2 ionization state, such as Mn, Mg, Zn, etc. The B species is typically a metal having a +3 ionization state, such as Fe. A typical microwave spinel compound is $Fe_3O_4$, in which the iron manifests both ionization states. Spinels have crystal structures that are similar to that of perovskites since the oxygen sub-lattice in the these compounds has the octahedral symmetry that is present in the perovskites. The magnetic spins are typically insulators and have very low coercive fields, of the order of 0.1 to 1.0 oersted, and therefore used in microwave applications.

Many of the advantages of the invention can also be enjoyed with a mixture of barium (Ba) and strontium for the primary metal, as was noted in the Ramesh et al. patent application.

It is understood that the qualifications of epitaxial growth and monocrystalline structure does not preclude the incidence of a normal degree of defects, including slip planes, occurring in the materials as long as the overall crystallinity and semiconductor properties are not affected on the scale of the final devices.

What is claimed is:

1. A functional metal oxide structure, comprising:

a crystalline silicon layer;

a first metal oxide layer comprising oxygen and at least one Group VB metal selected from the group consisting of vanadium, niobium, and tantalum epitaxially formed over said silicon layer; and a dielectric second metal oxide layer epitaxially formed over said first metal oxide layer.

2. The structure of claim 1, wherein said first metal oxide layer is a conductive metal oxide layer.

3. The structure of claim 2, further comprising;

a crystalline silicon substrate; and a dielectric layer formed over said substrate including an aperture therethrough formed to underlie a portion of said first metal oxide layer and said second metal oxide layer;

wherein said crystalline silicon layer is formed in said aperture.

4. The structure of claim 1, wherein said first metal oxide layer additionally comprises at least one of a Group IIA element selected from the group consisting of strontium and barium.

5. The structure of claim 4, wherein said first metal oxide layer additionally comprises titanium.

6. The structure of claim 5, wherein said conductive metal oxide has a composition of $Sr(Ti, V, Nb)O_3$.

7. The structure of claim 3:

wherein said crystalline silicon layer includes at its surface a source region, a drain region, and a gate region between said source and drain region;

wherein said second metal oxide layer comprises a ferroelectric layer; and further comprising two conductive metal oxide electrode layers sandwiching said ferroelectric layer.

8. The structure of claim 7, wherein said two conductive metal oxide electrode layers comprise a metal oxide selected from the group consisting of lanthanum strontium cobalate, lanthanum strontium vanadate, strontium ruthenate, and lathanum nickelate.

9. The structure of claim 7, further comprising a field oxide layer intermediate said crystalline silicon layer and a silicon plug epitaxially extending through said field oxide layer between one of said source and drain regions and said first metal oxide layer.

10. The structure of claim 7, wherein said first metal oxide layer overlies and electrically contacts said gate region.

11. The structure of claim 1, wherein said second metal oxide layer comprises a piezoelectric layer, thereby forming a micromechanical machined device.

12. The stricture of claim 1, wherein said second metal oxide layer conprises $MnLa_{1-x}(Ca, Sr, Ba)_xO_3$.

13. The structure of claim 1, wherein said second metal oxide layer comprises a spinel $AB_2O_4$, wherein A has a +2 ionization state and B has a +3 ionization state.

14. The structure of claim 13, wherein said spinel comprises $Fe_3O_4$.

15. A ferroelectric capacitor structure, comprising;

a crystalline silicon layer;

a doped strontium titanate layer including dopants formed over said silicon layer;

a first conductive metal oxide electrode layer formed over said doped strontium titanate layer;

a ferroelectric layer formed over said first conductive metal oxide electrode layer; and a second conductive metal oxide electrode layer formed over said ferroelectric layer;

whereby said first conductive metal oxide electrode layer is electrically controlled by said crystalline silicon layer by a current path through said doped strontium titanate layer.

16. The structure of claim 15, wherein said doped strontium titanate layer is epitaxially formed over said crystalline silicon layer.

17. The structure of claim 15, wherein dopants are selected from the group consisting of vanadium, niobium, and tantalum.

* * * * *